US009677952B2

(12) United States Patent
Bao et al.

(10) Patent No.: US 9,677,952 B2
(45) Date of Patent: *Jun. 13, 2017

(54) INTERFACE APPARATUS AND METHODS

(71) Applicant: The Board of Trustees of the Leland Stanford Junior University, Palo Alto, CA (US)

(72) Inventors: Zhenan Bao, Stanford, CA (US); Chee-Keong Tee, Stanford, CA (US); Stefan Christian Bernhardt Mannsfeld, Cameron Park, CA (US); Justin P. Opatkiewicz, San Diego, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,049

(22) Filed: Aug. 17, 2015

(65) Prior Publication Data
US 2016/0041652 A1    Feb. 11, 2016

Related U.S. Application Data

(63) Continuation of application No. 13/229,338, filed on Sep. 9, 2011, now Pat. No. 9,112,058.
(Continued)

(51) Int. Cl.
*G06F 3/045* (2006.01)
*G06F 3/041* (2006.01)
(Continued)

(52) U.S. Cl.
CPC .............. *G01L 1/146* (2013.01); *G01L 1/148* (2013.01); *G06F 3/044* (2013.01); *G06F 3/0412* (2013.01);
(Continued)

(58) Field of Classification Search
CPC . H01L 29/84; H01L 51/0055; H01L 51/0541; G06F 3/044; G06F 3/0414;
(Continued)

(56) References Cited

U.S. PATENT DOCUMENTS 4,370,697 A    1/1983  Haberl et al.
5,225,959 A    7/1993  Stearns
(Continued)

FOREIGN PATENT DOCUMENTS

CN      1675653 A       9/2005
WO      2009123388 A1   10/2009

OTHER PUBLICATIONS

News Release. "PPS Enters OEM Market with New Line of Digital Tactile Sensors." Pressure Profile Systems, Inc., Los Angeles, CA, 1 pg. (Mar. 3, 2006). http://www.pressureprofile.com.
(Continued)

*Primary Examiner* — Amit Chatly
(74) *Attorney, Agent, or Firm* — Crawford Maunu PLLC

(57) ABSTRACT

Input devices are provided. In accordance with an example embodiment, an input device includes an interface layer that flexes in response to pressure, a plurality of sense electrodes, a dielectric between the sense electrodes and the interface layer, and interconnecting circuitry. The dielectric compresses or expands in response to movement of the interface layer, and exhibits dielectric characteristics that vary based upon a state of compression of the dielectric. The interconnecting circuitry is to the sense electrodes and provides an output indicative of both the position of each sense electrode and an electric characteristic at each sense electrode that provides an indication of pressure applied to the dielectric adjacent the respective sense electrodes.

9 Claims, 5 Drawing Sheets

Related U.S. Application Data

(60) Provisional application No. 61/381,664, filed on Sep. 10, 2010.

(51) Int. Cl.
| | | |
|---|---|---|
| *G01L 1/14* | (2006.01) | |
| *H01L 29/84* | (2006.01) | |
| *G06F 3/044* | (2006.01) | |
| *H01L 51/00* | (2006.01) | |
| *H01L 51/05* | (2006.01) | |

(52) U.S. Cl.
CPC ............ *G06F 3/0414* (2013.01); *H01L 29/84* (2013.01); *G06F 2203/04102* (2013.01); *G06F 2203/04103* (2013.01); *G06F 2203/04107* (2013.01); *H01L 51/0055* (2013.01); *H01L 51/0541* (2013.01); *Y10T 29/49002* (2015.01); *Y10T 156/10* (2015.01)

(58) Field of Classification Search
CPC ......... G06F 3/0412; G06F 2203/04103; G06F 2203/04102; G06F 2203/04107; G01L 1/146; G01L 1/148; Y10T 156/10; Y10T 29/49002
USPC .................................................. 345/173–178
See application file for complete search history.

(56) References Cited

U.S. PATENT DOCUMENTS

| 6,452,514 | B1* | 9/2002 | Philipp ................ G01D 5/2405 178/18.06 |
|---|---|---|---|
| 7,179,561 | B2 | 2/2007 | Niu et al. |
| 7,609,178 | B2 | 10/2009 | Son et al. |
| 8,127,623 | B2 | 3/2012 | Son et al. |
| 8,272,276 | B2 | 9/2012 | Gorjanc et al. |
| 2002/0067344 | A1 | 6/2002 | Chiu |
| 2003/0234769 | A1* | 12/2003 | Cross .................... G06F 3/0412 345/173 |
| 2007/0227267 | A1 | 10/2007 | Loeb et al. |
| 2008/0087069 | A1 | 4/2008 | Renken et al. |
| 2008/0132313 | A1 | 6/2008 | Rasmussen et al. |
| 2008/0259262 | A1 | 10/2008 | Jones et al. |
| 2009/0027184 | A1 | 1/2009 | Forster |
| 2009/0237374 | A1 | 9/2009 | Li et al. |
| 2010/0033059 | A1 | 2/2010 | Choi et al. |
| 2010/0105443 | A1 | 4/2010 | Vaisanen |
| 2010/0178417 | A1 | 7/2010 | Connor et al. |
| 2010/0308844 | A1 | 12/2010 | Day et al. |
| 2011/0025631 | A1 | 2/2011 | Han |
| 2012/0062245 | A1 | 3/2012 | Bao et al. |
| 2012/0272751 | A1 | 11/2012 | Gorjanc et al. |

OTHER PUBLICATIONS

T.W. Lee, J. Zaumseil, Z. Bao, J.W.P. Hsu, J.A. Rogers, "Organic Light-emitting Diodes Formed by Soft Contact Lamination," Proc. Natl. Acad. Sci., vol. 101, p. 429-433, (2004).

A.L. Briseno, S.C.B. Mannsfeld, M.M. Ling, S. Liu, R.J. Tseng, C. Reese, M.E. Roberts, Y. Yang, F. Wudl, Z. Bao, "Large-area Patterning of Organic Single-crystal Arrays," Nature 2006, vol. 444, p. 913-917 (2006).

C.K. Tee, "High Sensitivity, Large Area, Flexible, Passive and Active Pressure Sensors Employing Structured Elastomeric Films," Abstract and Presentation. MRS Fall Meeting, (Dec. 2009).

L. Bergeron, "Stanford researchers' new high-sensitivity electronic skin can feel a fly's footsteps," Stanford Report, (Sep. 2010).

S.C.B. Mannsfeld, et al, "Highly sensitive flexible pressure sensors with microstructured rubber dielectric layers," Nature Materials, vol. 9, pp. 859-864 (2010).

"Electronic skin may someday restore touch," abc7news.com, 2011. Article accompanying video (1 pg).

B. Gruber, "From Star Wars to Stanford—scientists develop artificial skin," Reuters.com, Feb. 2011. Video Transcript, 1 pg.

Darlinski et al. "Mechanical force sensors using organic thin-film transistors," Journal of Applied Physics, vol. 97, pp. 1-4.

* cited by examiner

INTERFACE APPARATUS AND METHODS

RELATED DOCUMENTS

This patent document is a continuation under 35 U.S.C. §120 of U.S. patent application Ser. No. 13/229,338 filed on Sep. 9, 2011 (U.S. Pat. No. 9,112,058) claims benefit under 35 U.S.C. §119 to U.S. Provisional Patent Application Ser. No. 61/381,664, entitled "Flexible Pressure Sensing Apparatuses and Related Methods" and filed on Sep. 10, 2010; each of these patent documents and the Appendices filed in the underlying provisional application, including the references cited therein, are fully incorporated herein by reference.

FIELD

The present disclosure is directed to apparatuses and methods involving flexible input interfaces.

BACKGROUND

For a wide variety of applications, significant research has been directed to approaches for sensing various forms of pressure. This research has been largely driven by a growing market for pressure-responsive electronic devices including, among others, robotic tactile-sensing implementations such as used in environmental exploration and in industrial robotic manufacturing and touch-responsive display screens such as those having displays, for example, televisions, computer monitors, cell phones, personal digital assistants (PDA's), digital cameras, and music playback devices.

In many of these applications, a tactile-sensing device is used to explore a region of interest by causing engagement between the device and the region of interest. The interaction between the tactile-sensing device and the region of interest produces data that can be used to assess the region of interest. In the context of electronic devices, such as portable communication devices, touch panel/screen displays are designed to interact with a user, an electronic device is used to present or display information to a user for prompting the user to provide input to a touch-responsive aspect of the device, for example, an adjacent touch-responsive surface or the display screen itself. By using the display screen as the touch-responsive surface, the touch screen offers intuitive inputting for a computer or other data processing devices which is especially useful where benefit is realized by eliminating other input devices such as a keyboard and a mouse.

There are many different types of touch-sensing technologies, including capacitive, resistive, infrared, and surface acoustic wave. Each of these technologies sense the position of touches on a surface or screen and each provide certain relative advantages. However, the vast majority of these devices do not respond to the pressure that is applied against the touch screen and for those devices that do respond to applied pressure, they lack sufficient sensitivity for many applications.

SUMMARY

Aspects of the present disclosure relate generally to interfaces and methods relating to the applications discussed above.

In accordance with an example embodiment, an interface device includes a sensor having an impedance-based device with a flexible dielectric material, and that generates an output based on pressure applied to the dielectric material. The output corresponds to changes in dielectric properties of the dielectric material, corresponding to the applied pressure. In some implementations, a plurality of such sensors are included with an interface device, and interconnecting circuits respectively couple the sensors to provide an output indicative of, for each sensor, both the pressure applied to the dielectric material and the location of the applied pressure (e.g., relative to the position of the sensor). The changes in dielectric properties may, for example, be sensed as a change in an applied capacitive field, or a change in current through a channel to which such a field is applied. An output pertaining to pressure and position from the interface device can be used to interact with a computer or hand-held type of device, such as for interacting with information displayed on a screen or for providing control inputs used for gaming or other input aspects.

Another example embodiment is directed to an apparatus having an interface layer, a dielectric structure and a sense circuit. The interface layer flexes in response to an input signal presented to the interface in the form of pressure. The dielectric structure includes an elastomeric material that exhibits a first dielectric constant and, in response to the pressure applied to the interface layer, compresses and thereby exhibits a changed dielectric constant corresponding to a state of compression of the elastomeric material. This compression may, for example, be in response to a human touch input, and may involve a negative compression (e.g., expansion). The sense circuit responds to the change in dielectric constant by providing an indication of the pressure applied to the dielectric.

Another example embodiment is directed to a touch screen device. The device includes a substrate having a plurality of sensors, with each sensor including electrodes electrically coupled by a compressible elastic dielectric material that compresses (or expands) in response to pressure applied thereto, each sensor exhibiting a change in capacitance between the electrodes in response to a state of compression of the dielectric. A conductive shielding material is on the dielectric and passes light for presenting an image for viewing (e.g., passing at least about 75% of incident light, or higher for high-resolution applications). A light source passes light corresponding to an image for viewing through the conductive shielding material. Interconnecting circuits respectively couple the sensors and provide an output indicative of the capacitance of each sensor, therein providing an indication of an amount of pressure applied to the shielding material adjacent each sensor.

Another embodiment is directed to a method of manufacturing a sensor device. An interface that flexes in response to pressure is formed, and a dielectric is formed and coupled to the touch interface, the dielectric exhibiting a dielectric characteristic that varies based upon a state of compression thereof. A plurality of sense electrodes is formed, and the dielectric is coupled between the sense electrodes and the interface such that the dielectric compresses or expands in response to pressure applied to the touch interface. The sense electrodes are configured and arranged with the dielectric to generate an electrical output based on at least one of an electric field and an electric current at the sense electrode, based on a state of compression of the dielectric. Interconnecting circuits are coupled to the sense electrodes to provide an output indicative of both the position of each sense electrode and the at least one of the electric field and electric current at the sense electrode, therein providing an indication of pressure applied to the dielectric adjacent the respective sense electrodes.

The above summary is not intended to describe each embodiment or every implementation of the present disclosure. The figures, detailed description and claims that follow more particularly exemplify various embodiments.

BRIEF DESCRIPTION OF THE DRAWINGS

Aspects of the present disclosure may be more completely understood in consideration of the detailed description of various embodiments of the present disclosure that follows in connection with the accompanying drawings, in which.

Figure 1:
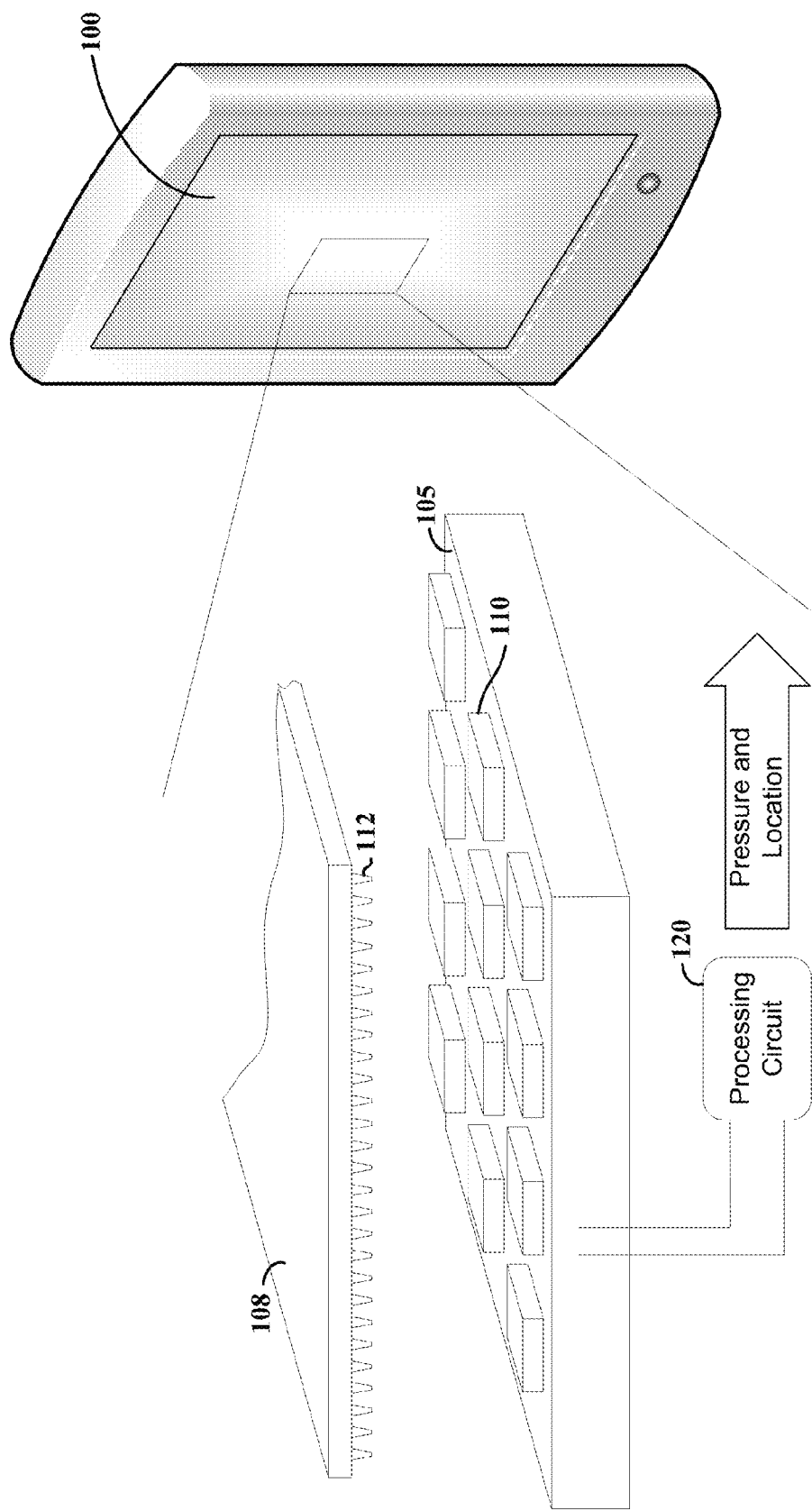
FIG. 1 shows an interface having an array of pressure-based sensors, in accordance with an example embodiment of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DETAILED DESCRIPTION

The present disclosure relates to pressure sensors, pressure-sensing devices and apparatuses, methods for manufacturing pressure sensors, and to methods of using pressure sensors. While the present disclosure is not necessarily limited to such devices and applications, various aspects of the disclosure may be appreciated through a discussion of examples using these and other contexts.

One aspect of the present disclosure, and in accordance with an example embodiment, relates to a type of input device comprising a plurality of sensors, each including an impedance-based device having a compressible elastic dielectric material and circuits separated by the dielectric material, with at least one node per sensor being indicative of an electrical characteristic such as capacitance or current. Each sensor is configured to generate an output in response to impedance changes due to an amount of pressure applied to the dielectric material that causes the dielectric material to compress or expand (e.g., as negative compression). Interconnecting circuits are respectively configured to couple the sensors and to provide an output indicative of pressure applied to the elastic dielectric at the respective sensors. For example, organic field-effect transistors can be manufactured with such a dielectric material, with the conductivity of the transistors (e.g., in their ON state) being related to the pressure. Accordingly, changes in pressure as amounting to either or both of increases and decreases in pressure are readily sensed and used to provide a pressure and location based input, such as for a computer type of device.

In some implementations, the sensors operate based upon a capacitance presented to an electrode via the dielectric. In other implementations, the sensors operate based upon current conducted via an electrode and in response to a bias applied to a channel region, in which the bias varies based upon the state of compression of the dielectric.

Dielectrics as discussed herein can be implemented, or tuned, to suit different applications. In some implementations, spaces or pockets are formed within the dielectric material and/or between individual patterned regions of the dielectric material. The spaces/pockets may be filled with a fluid, gas, or other material exhibiting compression properties that are different than that of the dielectric material, and facilitate the elastic deformation and recovery of the dielectric material in response to applied pressure. For example, the spacing and/or air pockets can be tailored to enhance the dielectric material's ability to return to an original shape, after deformation. In certain implementations, the cross-sectional shape of the dielectric can be set to facilitate responsiveness/recovery to deformation, and to set the sensitivity of the shape to applied pressure. For instance, modifying the shape of the cross-section of a dielectric material can allow greater compression distance per unit force, thus increasing the sensitivity of the dielectric material to pressure.

Another approach to setting characteristics of the dielectric material involves using different materials in different portions of a sensor and/or a combination of materials for a single sensor. For example, polydimethylsiloxane (PDMS), piezoelectric elastic materials, pyroelectric elastic polymers and ferroelectric elastic polymers can be patterned and used as discussed herein, alone or in combination with one another.

In addition, various portions of a sensor device can be configured to respond to applied pressures differently, with respect to material, shape and/or formation of spaces or air pockets. These approaches can be used to form sensors having a range of different sensing abilities. These sensing abilities can be tuned, for example, to a particular application or to a particular user. For example, by using air in the spaces/gaps, the displaced volume has a lower dielectric constant (=1.0) than an elastomer/dielectric (e.g., PDMS of ~3.0). Therefore, the increase in capacitance in the structured film arises from the reduction in the distance between the two electrode plates, and is enhanced further by the increase in effective dielectric constant.

Other aspects of the present disclosure are directed to a type of input device having a pressure-sensing apparatus that includes a circuit with an organic semiconductor substrate and/or other semiconductor material such as inorganic nanowires which are also flexible. The circuit with such deformable material provides sufficient material displacement in one or more directions (as in stretching and/or bending) for the indication of pressure. In some implementations, the circuit includes an elastic gate dielectric on the substrate configured to deform in response to pressure applied thereto, and a plurality of pressure sensors at different locations on the substrate.

Each such sensor includes a FET-like arrangement with source and drain electrodes, as well as a gate. For example, the source and drain electrodes can be coupled by a channel region that is in the substrate and adjacent the gate dielectric, and with the gate on the gate dielectric and configured to apply a bias to the channel region. The amount of the bias is responsive to deformation of the elastic gate dielectric in the channel region. The circuit is further configured with interconnecting conductors configured and arranged to couple a signal from each of the sensors, the signal being indicative of the deformation of the elastic gate dielectric via the applied bias.

Yet another aspect is directed to a type of apparatus or device having a three-dimensional touch screen display. The device comprises a transparent substrate having a plurality of sensors, with each sensor including electrodes electrically coupled by a compressible elastic dielectric material. The compressible elastic dielectric material compresses in response to pressure applied thereto, with each sensor being configured to exhibit an increased capacitance between the electrodes in response to the compression of the compressible elastic dielectric. The device can include a transparent conductive shielding material on the compressible elastic dielectric material, a light source configured to pass light corresponding to an image for viewing through the substrate and shielding material, and interconnecting circuits respectively coupling the sensors and providing a pressure-indicative output.

Input devices as discussed herein may be implemented in a variety of applications. For example, one such application includes touch screen devices such as hand-held devices, televisions and computer devices, in which the sensor passes light (e.g., using a transparent elastomer material such as PDMS). Other applications are directed to force-sensing methods, such as resistive pressure sensors using conductive filler particles in elastomers, or quantum tunneling composites. Certain applications are directed to sensing and using changes in pressure, such as may be exhibited in a pressure vessel upon the development of a leak (e.g., a loss in pressure can be detected as a change in conductivity due to dielectric changes). Certain embodiments of the present disclosure are directed to sensing devices, wherein at least one sensor includes an elastic dielectric that is configured to exhibit an impedance change due to elastic fringe capacitance (e.g., elastic fringe capacitor as a discrete element or part of a capacitive circuit).

Sensors as discussed in connection with one or more example embodiments can be manufactured using a variety of approaches, and can be implemented in a variety of applications. In one implementation, a sensor is manufactured on plastic substrates in a roll-to-roll process, which allows for high throughput and thus facilitates low commercialization costs. Accordingly, an elastomeric type roll can be manufactured with pressure-sensing electrodes in high-speed, facilitating the rapid manufacture of devices. Such sensors made on flexible substrates can be implemented with a variety of devices, such televisions, portable electronic devices such as mobile phones, computers or tablets, and with curvilinear surface applications relating to bottles, cans, and curved displays.

In some implementations, one or more of a material and shape of a dielectric elastomer is set to facilitate a response time to on and off pressure on the order of 10 ms or less, allowing for successive pressure sequences to be detected easily. For example, human finger actions are often physiologically limited to approximately 300 ms per action, such that response times faster than 300 ms facilitate the repeated application of pressure (e.g., taps).

In various embodiments, an elastomer/dielectric film as discussed herein is micropatterned to mitigate visco-elastic creep (e.g., a time-dependent increase in strain) and increases in relaxation times after compression, such as may relate to irreversible entanglement of polymer chains and the lack of a deformable surface. In connection with one or more such embodiments, it has been discovered that spaces (e.g., voids or gaps) between micro-structured portions of the film facilitate elastic deformation upon application of external pressure that, absent the spaces, may effect visco-elastic creep in the film at its thickness. This facilitates the film's ability to store and release energy reversibly. Accordingly, various embodiments are directed to a sensor having an elastomer/dielectric film having separate regions patterned with respect to one another and a space therebetween, to facilitate reversible elastic deformation upon an applied pressure. This spacing and patterning (e.g., and the shape of the film) can be set to suit a particular application and an expected applied pressure, relative to the material used and mechanical properties thereof. In addition, spacing can be set to achieve desirable transparency, such as for use in touch screen applications.

In certain embodiments, the elastic dielectric material for a sensor as discussed herein has a microstructure that connects circuit nodes of the sensor and a width dimension that is less than about 50 microns for certain implementations, less than about 30 microns for other implementations, and less than about 5 microns for certain other implementations. The dielectric layer may be a solid elastic dielectric layer for sensing the applied pressure, or may include a plurality of microstructures having gaps therebetween (e.g., filled with a non-solid material as discussed herein).

According to other aspects, in addition to displays, certain embodiments consistent with the instant disclosure use three-dimensional touch sensors on or as part of surfaces of input devices, which may include curved surfaces. Such devices include, for example, a computer mouse, rollable keyboards, or a gaming interface device. In some implementations, the sensors operate to replace mechanically-moving components such as buttons, and may be configured to provide an output corresponding to such components.

Turning now to the figures, FIG. 1 shows a touch screen device 100 having an array of pressure-based sensors on a substrate 105 (shown in the inset), in accordance with another example embodiment of the present disclosure. The array is shown by way of example as having sixteen sensors, with sensor 110 labeled by way of example. Over the sensors is an array of dielectric regions, including region 112 illustrated for example, which are connected to a flexible interface layer 108. The interface layer 108 and related dielectric regions are shown in cut-away view and separated from the underlying sensors for illustration, with the dielectric regions (112) being brought into contact with the sensors for operation.

Each of these sensors may be implemented, for example, with a touch-screen device 100 as shown, and with sensors such as shown and described herein and/or in the above-referenced Provisional Patent Application. Outputs of the sensors are coupled to a processing circuit 120, which processes the outputs to provide pressure and location information. For example, each of the sensors (including sensor 110) may be coupled directly to the processing circuit 120, or an array of interconnecting circuits in the substrate 105 may be made to provide an addressable output corresponding to a position of the respective sensors (e.g., in rows and columns), with a single lead connected to the processing circuit.

When pressure is applied to the flexible interface layer 108, the dielectric regions (112) compress at a region near the applied pressure, and the underlying sensors (110) sense the applied pressure via a change in dielectric properties of the dielectric regions near the sensor. By processing outputs of the sensors at processing circuit 120, an indication of both a location and an amount of pressure applied to the flexible interface layer 108 can be provided.

In some implementations, the flexible interface layer 108 has transparent characteristics, and passes light for use as a display. For instance, using PDMS for the dielectric regions 112 facilitates transparency therein. Similarly, the interface layer 108 may be implemented using a material having transparency characteristics. The display is responsive to pressure (e.g., as a touch screen), with the flexible substrate flexing in response to pressure applied thereto and, in response, causing deformation of the dielectric regions (112). The sensors (110) exhibit electrical changes based on the deformation and resulting changes in dielectric properties, thus providing an indication of the pressure. In this context, a three-dimensional touch screen device is provided, sensing both position (e.g., in an x-y direction of a plane in which the sensors lie) and pressure (e.g., in a z direction into/about perpendicular to the aforesaid plane). In such an application, the touch screen device 100 can be implemented, for example, as a hand-held device such as a telephone, computer, tablet or media device. Outputs from the processing circuit 120 can accordingly be used to indicate a position of a touch on the screen shown at device 100, as well as pressure, for selecting and manipulating objects displayed on the screen or otherwise providing an input relative to the display.

Figure 5:
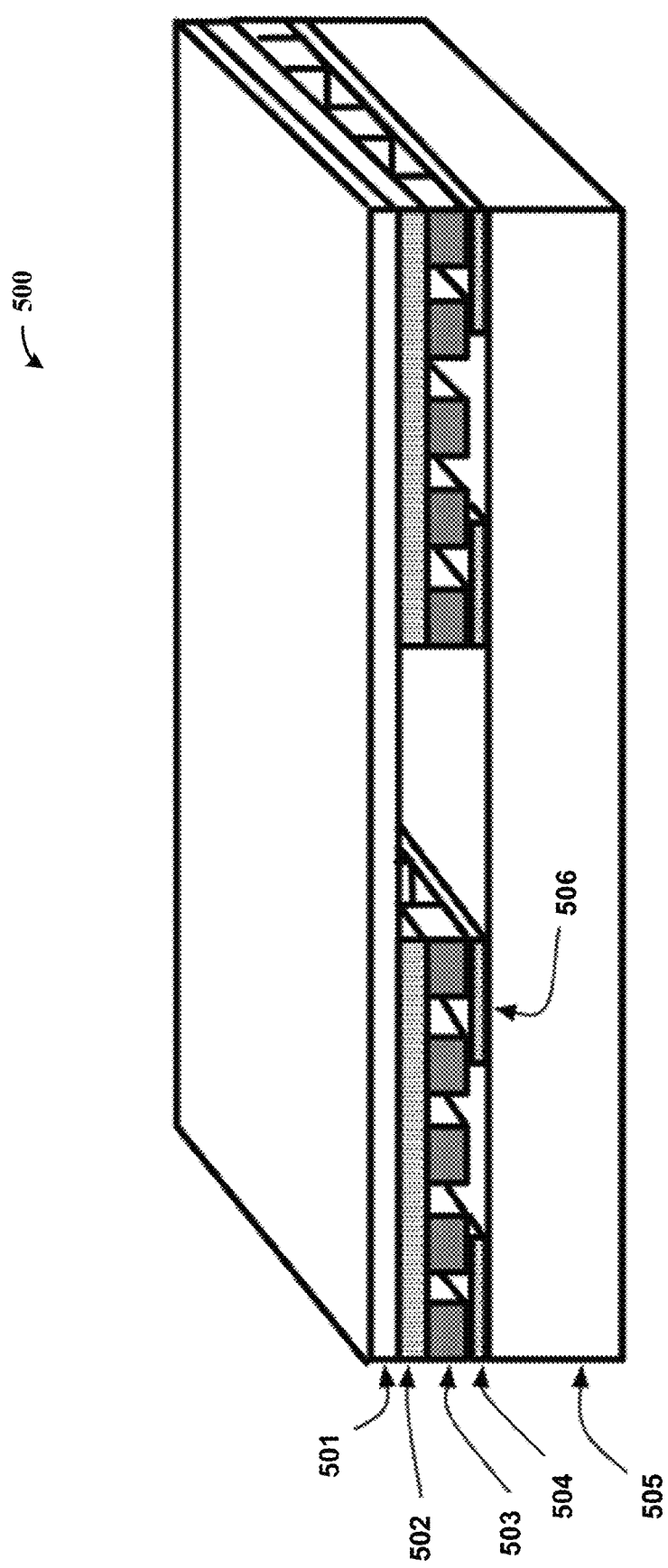
FIG. 5 shows a fringe-field device, in accordance with another example embodiment of the present disclosure.

FIG. 2 shows cross-sectional views of example sensors and respective elastomer shapes, in accordance with various example embodiments of the present disclosure. The respective sensors are shown having a common upper and lower region (e.g., two electrodes, or an electrode and an interface layer or a shielding layer as shown in FIG. 1 or 5), with differently-shaped elastomer materials being responsive in different manners to the application of a common pressure. Referring to FIG. 2A, upper and lower portions 210 and 212 are separated by an elastomer material that compresses as shown at 214, and having a generally vertical sidewall as shown at 216 in an uncompressed shape. As with corresponding upper portions in FIGS. 2B-2D, upper portion 210 is shown at both the uncompressed and compressed positions. Referring to FIG. 2B, upper and lower portions 220 and 222 are separated by an elastomer material that compresses as shown at 224, and having an inclined sidewall as shown at 226 in an uncompressed shape. Relative to compressed elastomer material 214 in FIG. 2A, the compressed elastomer material 224 exhibits a greater vertical compression in accordance with the different shape.

Figure 2A:
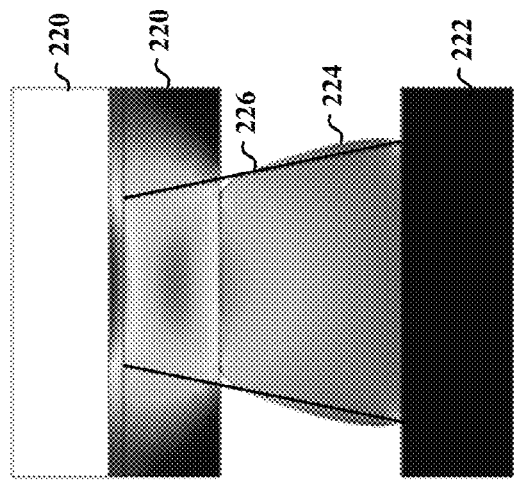
FIGS. 2A-2D show cross-sectional views of example sensors and respective elastomer shapes, in accordance with various example embodiments of the present disclosure.
Figure 2B:
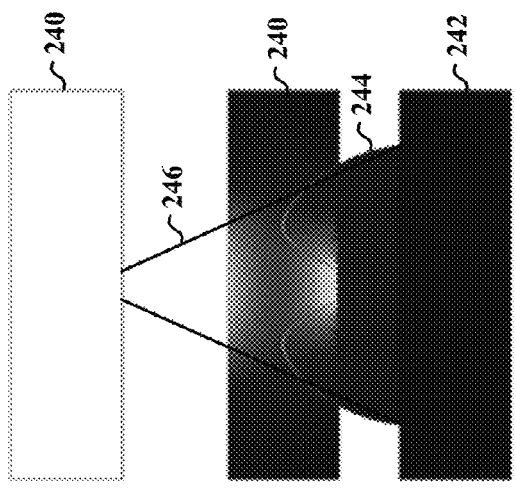
Figure 2C:
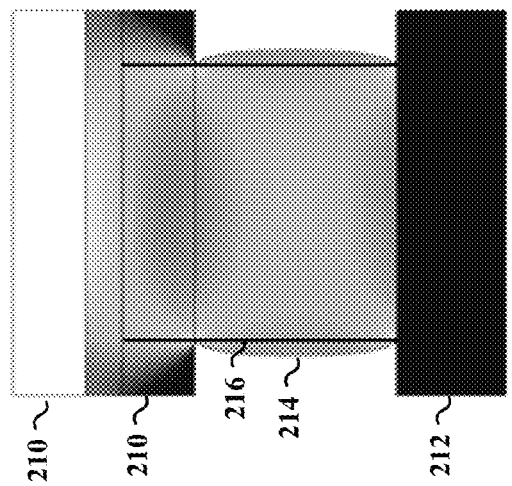
Figure 2D:
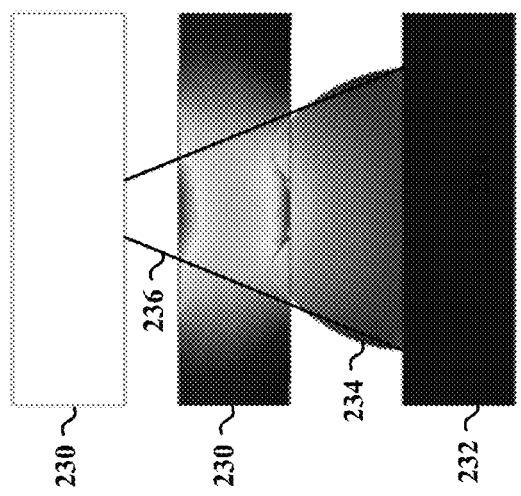
Figure 3A:
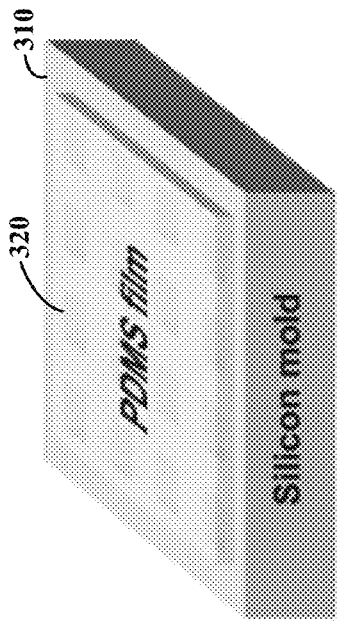
FIGS. 3A-3D show respectively a sensor having a microstructured polydimethylsiloxane (PDMS) film at various stages of manufacture, in accordance with various example embodiments of the present disclosure.
Figure 3B:
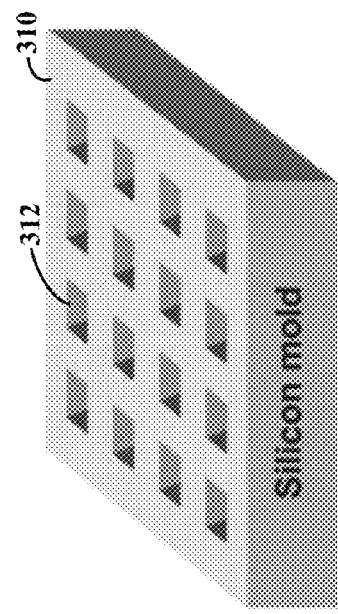
Figure 3C:
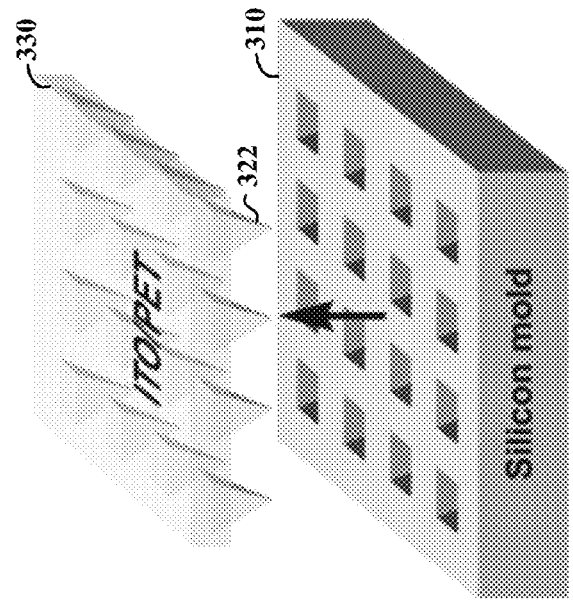
Figure 3D:
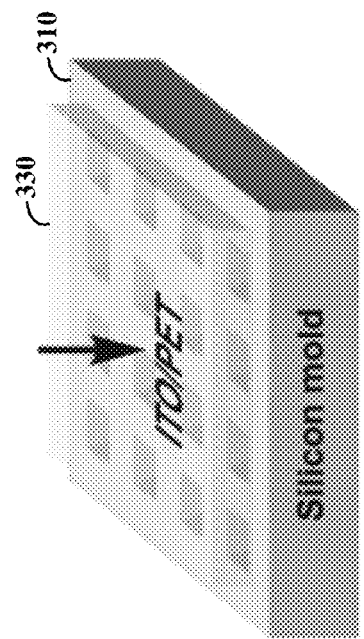

FIGS. 2C and 2D show sensors having elastomer materials with increasing degrees of inclination, and exhibiting increasingly greater deflection in response to a common pressure. Accordingly, FIG. 2C shows upper and lower portions 230 and 232 separated by an elastomer material that compresses as shown at 234, and exhibits an uncompressed shape as shown at 236. Similarly, FIG. 2D shows upper and lower portions 240 and 242 separated by an elastomer material that compresses as shown at 244, and exhibits an uncompressed shape as shown at 246.

As shown in FIG. 2, modifying the shape of the elastomer cross-section can thus allow greater compression distance per unit force, thus increasing the sensitivity of the elastomer layer to pressure. In this context, various embodiments are directed to the implementation of elastomers having cross-sections that tune, or set, characteristics of a sensor in which the elastomers are used. Moreover, elastomers having different cross-sections can be used in a common device to set different pressure-sensing characteristics for different portions of the device. In various implementations, the cross-section of an elastomer is altered to set the sensitivity to pressure, and can be set to sense pressure of less than 1 kPa (akin to a gentle touch).

In some implementations, the elastomeric layer as shown in FIG. 2 is shielded from the external environment by a conductive layer that keeps electric field lines within the elastomeric layer. Compressing the elastomer layer increases the effective dielectric constant of the material between electrodes (e.g., referring to FIG. 2A, upper and lower portions 210 and 212 can be implemented as electrodes). This increases the capacitance between the electrodes and thus, the pressure can be measured by the increase in capacitance.

FIG. 3 shows a sensor device having a micro-structured polydimethylsiloxane (PDMS) film, at various stages of manufacture, in accordance with various example embodiments of the present disclosure. FIGS. 3A-3D show a mold 310 (e.g., Silicon) having a plurality of inverse features 312. Referring to FIG. 3B, a PDMS film 320 is formed on the mold 310. At FIG. 3C a laminated film 330, such as indium tin oxide (ITO) coated poly(ethyleneterephthalate) (PET) substrate, is formed on the PDMS film 320, and the PDMS film is cured (e.g., cross-linked) under even pressure (e.g., at a temperature of about 70° C. for about three hours). At FIG. 3D, the laminated film 330 is removed, with individual portions of the PDMS film 320, including portion 322 as labeled for example, are shown formed on the film. The shape of the portion 322 is set by the shape of the inverse features (312), and set to suit the particular application with respect to compressibility.

The micro-structures in the PDMS film 320 can be manufactured in a generally uniform (2-3% pitch fidelity) arrangement across the mold 310. These features can be replicated with high quality on very thin (e.g., <100 μm) and highly flexible plastic sheets. This approach can be used to ensure large-area compatibility of a pressure sensor, with respect to the tallest three PDMS features (322) determining a contact plane. In addition, the PDMS features (322) can be set at a relatively small size (e.g., 3-6 μm or less in width, and less than 10 μm in height). In some implementations, a small glass plate is used to apply uniform pressure and improve lamination. Resulting film sensitivity can be achieved at about 0.55 kPa-1, with little to no hysteresis, and can detect weights of less than 20 mg and/or a pressure of about 3 Pa. Resulting film relaxation times can be achieved in the millisecond range.

A variety of different types of materials can be used to make sensors, in accordance with embodiments as discussed herein. In a particular example embodiment, a capacitive matrix-type pressure sensor is formed with all plastic components, apart from conductive or metal-type electrodes, by sandwiching a micro-structured dielectric film such as PDMS between an electrode and a shielding layer, with the electrode including, for example, a PET substrate (e.g., 25 μm thick) having conductors (e.g., vacuum-deposited aluminum metal lines (150 μm wide) that serve as address and data lines). The structure can be partitioned into sections (e.g., quadrants) of micro-structured PDMS film.

In some embodiments, a highly-stretchable material is used as a substrate to support patterned dielectric pillars to decrease signal spill-over from adjacent sensors (e.g., such that the translation of pressure upon a portion of the material/sensor to adjacent portions/sensors is mitigated or eliminated). For instance, such a material can be used in place of and/or with PET where implemented in various embodiments above.

In other embodiments, control circuitry is used to determine spillover based upon pressure sensed at different sensors within a matrix, using an algorithm-type input to determine an actual position of an applied pressure, relative to pressures sensed at different sensors. Referring to FIG. 1, this approach can be implemented with processing circuit 120, when connected to a multitude of sensors. Moreover, such an approach can be used to interpolate the position of an applied pressure at or between sensors.

Other embodiments are directed to the implementation of a matrix-type pressure sensor in a multi-touch device that collects pressure information at multiple points. These approaches can be used to collect different types of inputs for a variety of devices, such as gaming devices, hand-held electronic devices, mobile telephones, tablets, computers and others.

Figure 4:
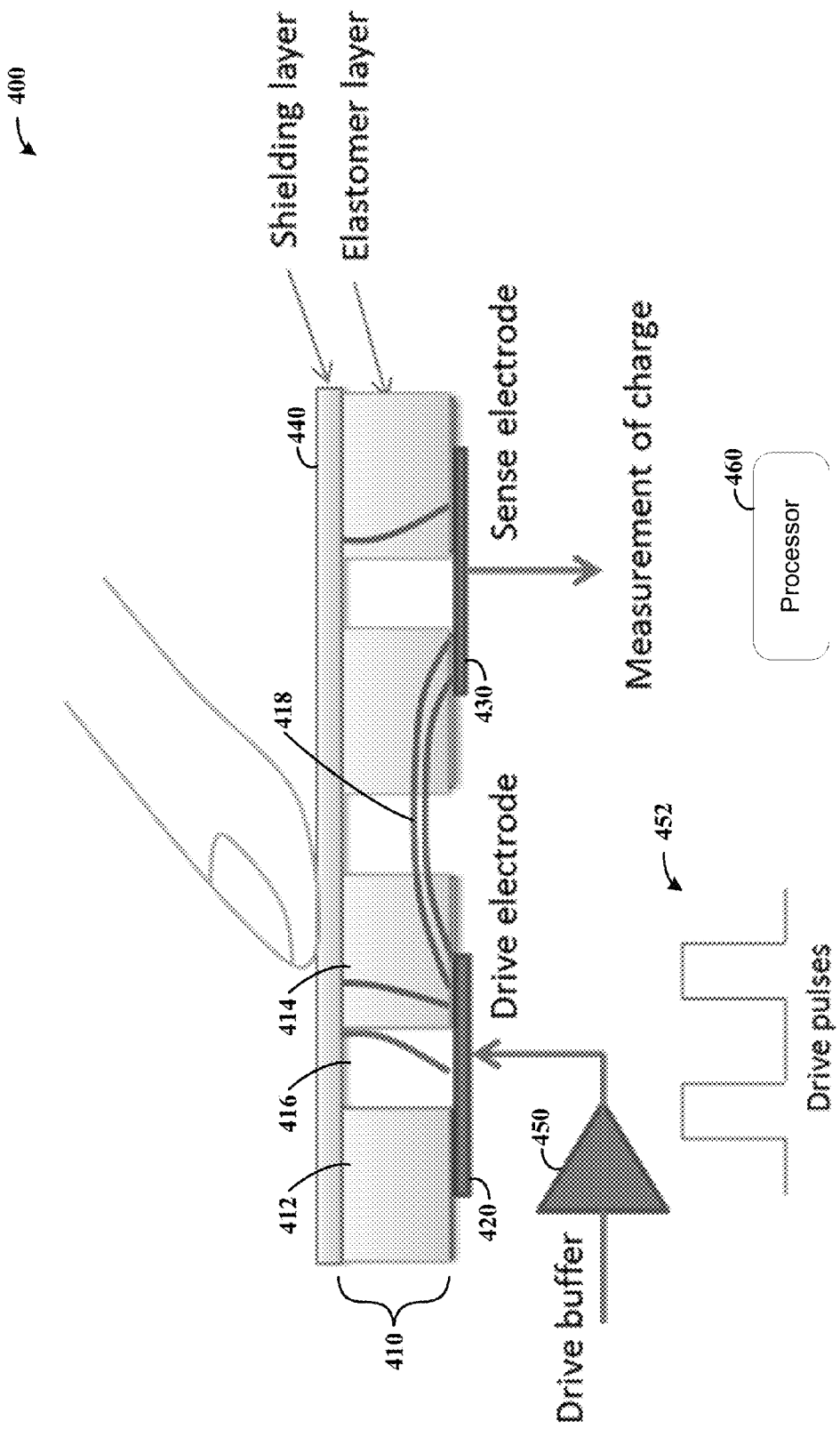
FIG. 4 shows a pressure and position thin film sensor, according to another example embodiment of the present disclosure.

FIG. 4 shows a pressure and position thin film sensor device 400, according to an example embodiment of the present disclosure. The device 400 includes an elastomer layer 410 that is configured and arranged to exhibit different electrical properties under pressure. A drive electrode 420 and a sense electrode 430 are separated from a shielding layer 440 by the elastomer layer 410. A drive buffer circuit 450 is coupled to apply a voltage to the drive electrode 420, such as by applying a pulsed signal as represented at 452.

The elastomer layer 410 includes a material that exhibits different dielectric characteristics based upon an amount of pressure applied via the shielding layer 440, such as by a human touch (shown by way of example). The sense electrode 430 provides an output that is based upon the drive pulses applied to the drive electrode 420 by the drive buffer circuit 450, and upon the amount of pressure applied on the shielding layer 440. As the elastomer layer 410 is compressed due to applied pressure, the output at the sense electrode 430 is indicative of this compression via a related change in dielectric properties of the elastomer layer.

The elastomer layer 410 includes different portions therein separated by gap-type regions. By way of example, elastomer portions 412 and 414 are shown as being separated by a gap region 416, which is defined laterally by sidewalls of the portions 412 and 414. As pressure is applied to the shielding layer 440, the elastomer portions 412 and 414 compress, with the gap region 416 facilitating this compression (e.g., with the gap region being filled with a gas such as air, the elastomer portions 412 and 414 readily compress). Fringe field lines, including line 418 labeled by way of example, develop in the sensor device 410 in response to the pulsed signal and based upon a current dielectric characteristic of the elastomer layer, as relative to a pressure applied thereto.

In various implementations, the sensor device 400 is implemented with an array of such devices, for sensing pressure and position. For example, by arranging a multitude of such sensors as part of a touch-sensitive device, the output of respective sense electrodes for each sensor can be used to detect pressure at the sensors. Moreover, relative pressure can be determined at the respective sensors by detecting variations in the outputs at the sense electrodes of each sensor.

In certain embodiments, the device 400 includes a processor 460 that processes the output of the sense electrode 430 to provide an indication of pressure applied to the shielding layer 440. In some implementations, the processor 460 uses the indication of pressure to carry out processing tasks, such as for effecting pressure-informed gestures that add to the intuitiveness of a human computer interface based on the pressure information acquired. For instance, light pressure on an input device can be used to select an object on a display, and heavier pressure can be used to move/drag the selected objects on the display. Various amounts of pressure may also be processed for gaming devices, such as to carry out different functions. Moreover, such a processor 460 may be implemented to compensate for variations, such as in atmospheric conditions (e.g., temperature) that can cause signal shift.

Referring now to FIG. 5, a fringe-field device 500 is shown, in accordance with another example embodiment. The device 500 may, for example, be implemented in accordance with the approach shown in FIG. 4. The device includes an encapsulating substrate 501 over a conductive shielding 502, which conductively shields a dielectric layer 503. As shown, the conductive shielding is patterned at locations of underlying sense regions, but may be implemented as a continuous layer, for particular applications (e.g., for an array of sensors, to read out pressure and position and mitigate cross-talk between sensors). In addition, the conductive shielding may be left floating, or set at ground potential.

The dielectric layer 503 has alternating regions of an elastomeric dielectric material and gap regions including a compressible substance such as air. The dielectric layer 503 is formed over respective electrodes, including drive electrode 504 mounted on a substrate 505 together with a sense electrode 506.

Another example embodiment is directed to a pressure sensor that senses both vertical loads and shear force, which may be implemented using an approach as shown, for example, in FIG. 5. Shear force information is detected by grouping of oriented pressure sensor fields with either asymmetric microstructures or asymmetrically-arranged symmetric microstructures in groups (e.g., by orienting pressure sensor fields in North, West, South and East directions with groups of 2×2 superpixels). The response to vertical loads in the four sub-units of such a superpixel will be the same, thus any signal difference originates from in-plane (shear) stress exerted onto the sensor surfaces. The signal from the grouped sensors is calibrated and used to determine the sheer force vector and magnitude. Using this approach, pressure and shear forces can be detected and used, for example, to detect slip.

The various embodiments as discussed herein may be implemented using a variety of structures and related operations/functions. For instance, one or more embodiments as described herein may be computer-implemented or computer-assisted, as by being coded as software within a coding system as memory-based codes or instructions executed by a logic circuit, computer processor, microprocessor, PC or mainframe computer. Such computer-based implementations are implemented using one or more programmable or programmed circuits that include at least one computer-processor and internal/external memory and/or registers for data retention and access. One or more embodiments may also be implemented in various other forms of hardware such as a state machine, programmed into a circuit such as a field-programmable gate array, implemented using electronic circuits such as digital or analog circuits. In addition, various embodiments may be implemented using a tangible storage medium that stores instructions that, when executed by a processor, performs one or more of the steps, methods or processes described herein. These applications and embodiments may also be used in combination; for instance certain functions can be implemented using discrete logic (e.g., a digital circuit) that generates an output that is provided as an input to a processor. For instance, circuits connected to sense electrodes of an input device may provide an output indicative of a pressure applied to dielectric adjacent the electrodes, which may also therein provide an indication of a position of the electrodes (source of the sensed pressure), and be implemented as a user-input for a variety of devices such as a computer, portable device or gaming device.

The embodiments and specific applications discussed herein may be implemented in connection with one or more of the above-described aspects, embodiments and implementations, as well as with those shown in the above-referenced provisional patent document, the Appendices that form part of that document, and the references cited therein. This underlying provisional patent document, including the Appendices, as well as the references cited therein are fully incorporated herein by reference.

While the present disclosure is amenable to various modifications and alternative forms, specifics thereof have been shown by way of example in the drawings and will be described in further detail. It should be understood that the intention is not to limit the disclosure to the particular embodiments and/or applications described. On the contrary, the intention is to cover all modifications, equivalents, and alternatives falling within the spirit and scope of the present disclosure.

What is claimed is:

1. An apparatus comprising:
an interface layer configured and arranged to flex in response to an input signal presented to the interface in the form of pressure;
an elastomer including a plurality of elastomer regions separated by one another by gaps, wherein at least one of the plurality of elastomer regions has at least one cross-section of less than 50 microns in terms of width dimension, and is shaped and sized to compress at the cross-section thereof and thereby exhibits a changed dielectric constant in response to an applied pressure or a change in pressure of less than 1 kPa, and the plurality of elastomer regions have width and thickness dimensions and are configured and arranged to, in response to an application of pressure or a change in pressure exhibit a changed dielectric constant corresponding to a state of compression of the elastomer; and
a sense circuit, including a portion of the elastomer, configured and arranged to respond to the changed dielectric constant by providing an electrical output indicative of the pressure applied or the change in pressure applied to the elastomer.

2. An apparatus comprising:
an interface layer configured and arranged to flex in response to an input signal presented to the interface in the form of pressure;
an elastomer including a plurality of elastomer regions separated by one another by gaps, wherein the plurality of elastomer regions have width and thickness dimensions and are configured and arranged to, in response to an application of pressure or a change in pressure exhibit a changed dielectric constant corresponding to a state of compression of the elastomer; and
a sense circuit, including a portion of the elastomer and including opposing, electrodes which are separated by the portion of the elastomer by a distance of less than 100 um before the state of compression, and the plurality of elastomer regions are shaped and sized to compress at a cross-section thereof and thereby exhibit the changed dielectric constant in response to sequential applications of pressure, and recover from each application of pressure in less than 300 msec, the sense circuit being configured to respond to the changed dielectric constant by providing an electrical output indicative of the pressure applied or the change in pressure applied to the elastomer.

3. An apparatus comprising:
an elastomer including a plurality of elastomer regions separated from one another by gaps, wherein the plurality of elastomer regions have width and thickness dimensions and are shaped and sized to compress at a cross-section thereof and are configured and arranged to respond to a change in pressure applied to the elastomer of less than 1 kPa and thereby exhibit a changed dielectric constant corresponding to a state of compression of the elastomer; and
a sense circuit, including a portion of the elastomer and having opposing electrodes separated by the portion of the elastomer, the sense circuit configured and arranged to respond to the changed dielectric constant by providing an indication of the pressure applied to the portion of the elastomer between the opposing electrodes of the sense circuit.

4. The apparatus of claim 3, wherein the elastomer and the sense circuit are configured and arranged to sense pulsed signals by tactile engagement with skin of a user and respond to the changed dielectric constant by providing the indication of the pressure applied to the portion of the elastomer at each of a plurality of sequential applications of pressure.

5. The apparatus of claim 3, wherein
the sense circuit further includes a plurality of pairs of opposing electrodes arranged on a planar substrate, and
the elastomer is configured and arranged to compress between at least one of the pairs of opposing electrodes in response to pressure applied to the portion of the elastomer over the at least one of the electrodes.

6. The apparatus of claim 3, wherein the sense circuit includes a plurality of opposing electrodes, each opposing electrode being configured and arranged to respond to a change in the dielectric constant of one of the plurality of elastomer regions of the elastomer immediately adjacent the opposing electrode, relative to elastomer regions adjacent other opposing electrodes, therein providing an indication of both the pressure applied to the elastomer and a position of the applied pressure.

7. The apparatus of claim 6, further including a logic circuit connected to the opposing electrodes and configured and arranged to process outputs from the opposing electrodes to determine pressure applied to the elastomer region immediately adjacent at least one of the opposing electrodes and a location of the applied pressure, and wherein the elastomer includes conductors therein, the conductors being arranged as address and data lines through which the outputs from the opposing electrodes are accessible.

8. The apparatus of claim 3, wherein respective ones of the plurality of elastomer regions are differently-shaped with differently sized cross-sections and are configured and arranged to set different pressure-sensing characteristics for different portions of the elastomer.

9. The apparatus of claim 3, wherein the opposing electrodes are separated by the portion of the elastomer by a distance of less than 100 um before the state of compression.

* * * * *